United States Patent
Prasad et al.

(10) Patent No.: US 7,318,214 B1
(45) Date of Patent: Jan. 8, 2008

(54) SYSTEM AND METHOD FOR REDUCING PATTERNING VARIABILITY IN INTEGRATED CIRCUIT MANUFACTURING THROUGH MASK LAYOUT CORRECTIONS

(75) Inventors: Roy V. Prasad, Los Gatos, CA (US); Chi-Song Horng, Palo Alto, CA (US); Ram S. Ramanujam, Santa Cruz, CA (US)

(73) Assignee: Invarium, Inc., San Jose, CA (US)

( * ) Notice: Subject to any disclaimer, the term of this patent is extended or adjusted under 35 U.S.C. 154(b) by 398 days.

(21) Appl. No.: 10/841,079

(22) Filed: May 7, 2004

Related U.S. Application Data

(60) Provisional application No. 60/480,286, filed on Jun. 19, 2003.

(51) Int. Cl.
*G06F 17/50* (2006.01)
(52) U.S. Cl. .......................................... 716/21; 716/10
(58) Field of Classification Search ................ 716/10, 716/19–21
See application file for complete search history.

(56) References Cited

U.S. PATENT DOCUMENTS

| | | | |
|---|---|---|---|
| 5,308,991 A | 5/1994 | Kaplan | |
| 5,528,508 A | 6/1996 | Russell et al. | |
| 5,573,890 A | 11/1996 | Spence | |
| 5,705,301 A | 1/1998 | Garza et al. | |
| 5,858,580 A | 1/1999 | Wang et al. | |
| 5,862,058 A | 1/1999 | Samuels et al. | |
| 5,888,675 A | 3/1999 | Moore et al. | |
| 5,978,085 A | 11/1999 | Smith et al. | |
| 6,048,651 A | 4/2000 | Brunner et al. | |
| 6,091,486 A | 7/2000 | Kirk | |
| 6,130,747 A | 10/2000 | Nomura et al. | |
| 6,269,472 B1 | 7/2001 | Garza et al. | |
| 6,289,499 B1 | 9/2001 | Rieger et al. | |

(Continued)

FOREIGN PATENT DOCUMENTS

GB  2375403  11/2003

(Continued)

OTHER PUBLICATIONS

"Correcting Design Data for Manufacture," U.S. Appl. No. 10/860,852, filed Jun. 4, 2004, inventors: Vishnu Kamat.

(Continued)

*Primary Examiner*—Stacy Whitmore
(74) *Attorney, Agent, or Firm*—Sheppard Mullin Richter & Hampton LLP

(57) ABSTRACT

The present invention provides a system and method of modifying the mask layout shapes of an integrated circuit layout design to compensate for reticle field location-specific systematic CD variations resulting from mask writing process variations, lens imperfections in lithographic patterning, and photoresist process variations. Called PLC (Process-optimized Layout Compensation), each set of compensation rules according to the present invention is specifically tailored for a particular mask-writer-patterning-tools-and-resist-process combination, and are performed on a reticle-wide basis. Furthermore, for each geometric shape in the mask layout, the amount of modification is determined based on a categorization of the type of the shape, the specific location in the reticle field the particular shape falls in, its context (i.e., surrounding patterns, orientation, etc.), as well as certain photoresist parameters to be used in the patterning process.

36 Claims, 14 Drawing Sheets

U.S. PATENT DOCUMENTS

| | | | |
|---|---|---|---|
| 6,303,251 | B1 | 10/2001 | Mukai et al. |
| 6,311,319 | B1 | 10/2001 | Tu et al. |
| 6,356,345 | B1 | 3/2002 | McArthur et al. |
| 6,396,569 | B2 | 5/2002 | Zheng et al. |
| 6,403,477 | B1 | 6/2002 | Tounai |
| 6,413,683 | B1 | 7/2002 | Liebmann et al. |
| 6,430,737 | B1 | 8/2002 | Cobb et al. |
| 6,444,373 | B1 | 9/2002 | Subramanian et al. |
| 6,453,452 | B1 | 9/2002 | Chang et al. |
| 6,453,457 | B1 | 9/2002 | Pierrat et al. |
| 6,470,489 | B1 | 10/2002 | Chang et al. |
| 6,529,623 | B1 | 3/2003 | Kent |
| 6,532,585 | B1 | 3/2003 | Petranovic et al. |
| 6,553,559 | B2 | 4/2003 | Liebmann et al. |
| 6,584,609 | B1 | 6/2003 | Pierrat et al. |
| 6,646,729 | B2 | 11/2003 | van der Laan et al. |
| 6,686,100 | B2 | 2/2004 | Martin et al. |
| 2002/0091986 | A1 | 7/2002 | Ferguson et al. |
| 2002/0138810 | A1 | 9/2002 | Lavin et al. |
| 2003/0003385 | A1 | 1/2003 | Martin |
| 2003/0088847 | A1 | 5/2003 | Chang et al. |
| 2003/0098970 | A1 | 5/2003 | Fung |
| 2003/0121021 | A1 | 6/2003 | Liu et al. |
| 2003/0192013 | A1 | 10/2003 | Cote et al. |
| 2003/0192025 | A1 | 10/2003 | Liu |

OTHER PUBLICATIONS

"Method of Characterizing Flare," Invarium, Inc. U.S. Appl. No. 10/860,853, filed Jun. 4, 2004, inventors: Bo Wu, Abdurrahman Sezginer.

"Method for Characterization of the Illuminator in a Lithographic System," U.S. Appl. No. 10/960,357, filed Oct. 6, 2004, inventors: Franz X. Zach, Bo Wu, and Abdurrahman Sezginer.

"System and Method for Compensating for Aberrations in a Photolithographic Process," U.S. Appl. No. 10/841,025, filed May 7, 2004, inventor: Roy V. Prasad.

"System and Method for Reducing Patterning Variability in Integrated Circuit Manufacturing through Mask Layout Corrections," U.S. Appl. No. 10/841,079, filed May 7, 2004, inventors: Roy V. Prasad, Chi-Song Horng, and Ram S. Ramanujam.

"Method and System for Designing Manufacturable Patterns that Account for the Pattern- and Position-Dependent Nature of Patterning Processes," U.S. Appl. No. 10/861,170, filed Jun. 4, 2004, inventor: Abdurrahman Sezinger.

"Characterizing Flare of a Projection Lens," U.S. Appl. No. 10/933,090, filed Sep. 1, 2004, inventors: Bo Wu, Abdurrahman Sezginer, Franz X. Zach.

"Method for Correcting Position-Dependent Distortions," U.S. Appl. No. 10/933,192, filed Aug. 31, 2004, inventors: Devendra Joshi, Abdurrahman Sezginer, Franz X. Zach.

A. K-T Wong, Resolution enhancement techniques in optical lithography, SPIE Press, vol. TT47, Bellingham, WA, pp. 91-115, 2001.

H. J. Levinson, Principles of Lithography, SPIE Press, Bellingham, WA, pp. 257-283 and 771-802, 2001.

Abramowitz, M. and Stegun, I. A. (Eds.), Ch. 22, Handbook of Mathematical Functions with Formulas, Graphs, and Mathematical Tables, 9th printing. New York: Dover, pp. 771-802, 1972.

Born, M. and Wolf, E., Principles of Optics, Ch. 9, 6th ed. New York: Pergamon Press, pp. 459-490 and 523-527, 1989.

C. Bodendorf, et al., Impact of measured pupil illumination fill distribution on lithography simulation and OPC models, Proc. SPIE vol. 5377, Article 110, 2004.

G. McIntyre et al., "Characterizing illumination angular uniformity with phase shifting masks," Proc. SPIE vol. 5040, Article 16, 2003, SPIE Bellingham, WA.

C. Mack, "Inside PROLITH: A Comprehensive Guide to Optical Lithography Simulation," pp. 67-112, 1997, Finle Technologies, Austin, TX.

Robertson et al., "An Improved Notch Model for Resist Dissolution in Lithography Simulation," SPIE vol. 4345, 9 pages undated.

D.G. Flagello, "Theory of high-NA imaging in homogeneous thin films," Optical Society of America, A, vol. 13, No. 1, 1996.

E. Luce et al., "Flare impact on the intrafield CD control for sub-0.25 um patterning," SPIE vol. 3679, p. 368-381, Mar. 1999.

Gill, P. R.; Murray, W.; and Wright, M. H. "The Levenberg-Marquardt Method," §4.7.3 in Practical Optimization. London: Academic Press, pp. 136-137, 1981.

Golub, G. H. and Van Loan, C. F., Matrix Computations, Sect. 2.5.3 and 2.5.6, 3rd ed. Baltimore, MD: Johns Hopkins University Press, 1996.

Granik, "Dry etch proximity modeling in mask fabrication," Yuri Publication: Proc. SPIE vol. 5130, p. 86-91, Photomask and Next-Generation Lithography Mask Technology X; Hiroyoshi Tanabe; Ed. (Aug. 2003).

H. Nomura et al., "Higher order aberration measurement with printed patterns under extremely reduced 6 illumination," Proc. SPIE vol. 3679, p. 358-367, SPIE, Bellingham, WA, 1999.

J.P. Kirk et al., "Application of blazed gratings for determination of equivalent primary azimuthal aberrations," Proc. SPIE vol. 3679, p. 70-76, 1999.

J. P. Cain, "Characterization of Spatial Variation in Photolithography," M.S. thesis, University of California, Berkeley, 2002.

J.A. Kong, Electromagnetic Wave Theory, John Wiley & Sons, 2nd Ed., pp. 370-403, 1990.

J.M. Geary, Introduction to Wavefront Sensors, vol. TT18, SPIE Optical Engineering Press, Bellingham, WA, pp. 53-103, 1995.

J.P. Kirk, "Scattered light in photolithographic lenses," Proc SPIE 2197, p. 566-572, SPIE, Bellingham, WA, 1994.

Kirkpatrick, S., C. D. Gelatt Jr., M. P. Vecchi, "Optimization by Simulated Annealing," Science, 220, No. 4598, pp. 671-680, 1983.

Koza, J. R., "Genetic Programming: On the Programming of Computers by Means of Natural Selection," Cambridge, MA: MIT Press, 1992.

M. Terry et al., "Behavior of lens aberrations as a function of wavelength on KrF and ArF lithography scanners," Proc. SPIE vol. 4346, p. 15-24, 2001.

Mark van der Kerkof, et al, "Full optical column characterization of DUV lithographic projection tools," SPIE 29th Annual International Symposium on MicroLithography, paper 5377, Article 212, Feb. 22-27, 2004, Santa Clara, CA.

Metropolis, N., A. Rosenbluth, M. Rosenbluth, A. Teller, E. Teller, "Equation of State Calculations by Fast Computing Machines," J. Chem. Phys., 21, 6, 1087-1092, 1953.

Nomura, "New phase shift gratings for measuring aberrations," Proc. SPIE vol. 4346, p. 25-35, 2001.

P. Dirksen et al., "Determination of resist parameters using the extended Nijboer-Zernike theory," Proc. SPIE vol. 5377, Article 13, SPIE, Bellingham, 2004.

Press, W. H.; Flannery, B. P.; Teukolsky, S. A.; and Vetterling, W. T. "Interpolation and Extrapolation." Ch. 3 in Numerical Recipes in FORTRAN: The Art of Scientific Computing, 2nd ed. Cambridge, England: Cambridge University Press, pp. 99-122, 1992.

Schneider et al. "Compensation of long-range process effects on photomasks by design data correction," Proc. SPIE vol. 5148, p. 179-188, 19th European Conference on Mask Technology for Integrated Circuits and Microcomponents; Jun. 2003.

T. Brunner et al., "Impact of resist blur on MEF, OPC, and CD control," Proc. SPIE 5377, SPIE Bellingham, WA, 2004.

J.P. Stirniman, M.L. Rieger, "Fast proximity correction with zone sampling," Proc. SPIE, vol. 2197, pp. 294-301, 1994.

Nicolas Bailey Cobb, "Fast Optical and Process Proximity Correction algorithms for integrated circuit manufacturing," Ph.D. Thesis, Univ. of Calif., 123 pages, 1998.

Frank M. Schellenberg, "Resolution Enhancement with OPC/PSM," Future Fab Intl., vol. 9, Jan. 2000.

Haolin Zhang, "Casual Analysis of Systematic Spatial Variation in Optical Lithography," Ph.D. Thesis, Univ. of Calif., Berkeley, 14 pages, Jun. 2002.

Jason P. Cain and Costas J. Spanos, "Electrical linewidth metrology for systematic CD variation characterization and causal analysis," Proc. SPIE, vol. 5038, pp. 350-361, 2003.

Liebmann, "Layout Impact of Resolution Enhancement Techniques: Impediment or Opportunity?," ISPD '03, Monterey, CA, pp. 110-117, Apr. 2003.

"Litel Instruments—ISI Product Overview," http://litel.net/isi_product.htm, 2 pages, printed Jan. 26, 2004.

"'The MEEF Meter': a Realistic Approach for Lithography Process Monitoring," Yield Management Solutions, pp. 52-57 (Aug. 2000).

Granik et al., "New Process Models for OPC at sub-90nm Nodes," Deep Submicron Technical Publications, presented at SPIE 2003, 11 pages, May 2003.

Wojcik et al., "Laser Alignment Modeling Using Rigorous Numerical Simulations," SPIE vol. 1463 Optical/Laser Microlithography IV, pp. 292-303, 1991.

J. P. Kirk et al. "Pupil Illumination; in situ measurement of partial coherence", Proc. SPIE vol. 3334, 1998, p. 281-288.

F. Zach et al. "Aberration Analysis using Reconstructed Aerial images of Isolated Contacts on Attenuated Phase shift masks."

P. Dirksen et al, "Characterization of a Projection Lens Using the Extended Nijboer-Zernike Approach," Proc. SPIE vol. 4691 (2002), p. 1392.

N. Cobb et al., "Mathematical and CAD Framework for Proximity Correction," Proceedings of the SPIE, vol. 2726 (1996), p. 208.

T. A. Brunner, "Approximate Models for Resist Processing Effects," SPIE vol. 2726 (1996), p. 198.

J. Schacht et al., "Calibration of OPC models for multiple focus conditions," Proc. SPIE. vol. 5377 (2004), p. 691-702.

Born and Wolf, "Principles of Optics," Cambridge University Press, 7th edition, pp. 459-490, 1999.

N. Cobb, "Fast Optical and Process Proximity Correction Algorithms for Integrated Circuit Manufacturing," Ph.D. Thesis, University of California, Berkeley, 1998.

A. Rosenbluth et al., "Fast Calculation of Images for High Numerical Aperture Lithography," Proceedings of the SPIE vol. 5377 (2004), p. 615.

F. Zach, "Neural Network Based Approach to Resist Modeling and OPC," Proceedings of the SPIE, vol. 5377 (2004) p. 670.

Dirksen et al., "Novel Aberration Monitor for Optical Lithography," Proc. SPIE vol. 3679 (1999), p. 77.

Erdmann et al., "Comparison of Simulation Approaches for Chemically Amplified Resists," SPIE vol. 4404, 12 pages, undated.

4X Reticle

One exposure onto a wafer

SYSTEM AND METHOD FOR REDUCING PATTERNING VARIABILITY IN INTEGRATED CIRCUIT MANUFACTURING THROUGH MASK LAYOUT CORRECTIONS

CROSS-REFERENCE TO RELATED APPLICATION

This application claims the benefit of U.S. provisional application No. 60/480,286, filed Jun. 19, 2003, which is hereby incorporated by reference.

BACKGROUND OF THE INVENTION

1. Field of the Invention

The present invention relates in general to integrated circuit (IC) manufacture, and more particularly to improving patterning accuracy and minimization of line-width variations in the optical patterning process used to print a pattern on a photoresist layer on a semiconductor wafer.

2. Description of Related Art

Manufacture of integrated circuit devices involves repeated sequences of the steps of deposition, photolithographic patterning, and etching. During deposition, a layer of conductive or insulating material is deposited on the surface of a silicon wafer. This material is then coated with a photosensitive resist. During the step of photolithographic patterning, which includes a set of optical and chemical processes, images of some desired geometric patterns residing on a photomask (also referred to as a "reticle" or simply "mask") are transferred onto the photo resist. The wafer is then developed and etched to remove material from the areas exposed to light, corresponding to clear areas in the photomask images. This is illustrated in FIG. 1. The sequence is repeated a number of times to implement the desired circuit structures.

The primary tool used for projecting a circuit image from a photomask onto a resist-coated wafer is the wafer stepper. They are generally of two kinds: a "step-and-repeat" type and a "step-and-scan" type. In both cases the photomask or reticle generally contains multiple copies of the master image of a chip layout design, and the exposure is performed at an entire "reticle field" level, as illustrated in FIG. 2. In some instances, a single photomask may also consist of layouts for multiple devices, a practice quite frequent in foundries.

Advances in the patterning technologies have enabled the printing of ever-smaller features onto a silicon wafer. The resolution of a lithographic process refers to its ability to separate component parts of an image, as measured by the smallest feature size or Critical Dimension (CD) that is printable with the given process. The CD is a function of three parameters:

$$CD = k_1 (\lambda/NA)$$

where $\lambda$ is the wavelength of the exposure light, NA is the numerical aperture of the projection system, and $k_1$ is a process-related factor that serves as a measure of the degree of "difficulty" of the lithographic process.

Continuing minimum CD reduction and tighter CD uniformity control are of paramount importance in the manufacture of integrated circuits. They allow device manufacturers to produce smaller, faster, and lower power products at ever-lower costs. The reduction in CD is achieved by decreasing $\lambda$, increasing NA, or decreasing k1. The reduction in $\lambda$ follows a step function, going from 365 nm, to 248 nm, to the current state-of-the-art 193 nm, where each step typically lasts 5~8 years. Current state-of-the-art 90 nm IC manufacturing process has a printable CD on the order of around 50~60 nm. But as the CD drops below the illumination wavelength, the image quality degrades rapidly due to diffraction and other effects. Pattern sizes become increasingly sensitive to the characteristics of the patterning tools and fluctuations in the manufacturing process.

In order to achieve superior patterning, a number of resolution enhancement techniques (RET) have been developed over time. Such RET's have now become a part of the IC design-manufacturing flow. Examples of current RET's include optical proximity corrections (OPC), off-axis illumination (OAI), phase-shift masks (PSM), and tiling. The practice of these prior art RET techniques follows a process flow shown in FIG. 3.

The challenge in patterning at deep sub-wavelength feature sizes stems from the fact that image patterns as printed on the wafer get distorted from the original intended patterns, as illustrated in FIG. 4. An example of such image shape distortions is line shortening, whereby the length of a printed line is less than its intended nominal length. Another form of image distortion is corner rounding, where an intended sharp corner turns into a rounded one. Yet another type of image distortion is the so-called iso-dense effect, whereby lines print thinner when they are isolated (i.e., by themselves) than if they were amidst other patterns. Further, the part of a line emerging from a cluster of patterns often prints thinner than other parts of the same line within the cluster of patterns. Other factors that cause the same nominal line width to print differently include environmental variations, developer induced effects, and etch effects.

RET's, especially OPC techniques, attempt to compensate for patterning process aberrations and variabilities to achieve better patterning accuracy and CD uniformity control. Some of these prior art techniques are illustrated in FIG. 5. For years, IC manufacturers have compensated isolated lines by making them wider (called iso-dense biasing). More recently, a variety of optical proximity corrections (OPC) have been brought into practice. The simplest OPC examples attempt to offset the loss of high frequencies or counter the effects of diffraction and/or scattering by appending the intended layout features with sub-resolution assist features or SRAF's such as serifs, hammerheads, corner cutouts, and scattering bars. These SRAF's do not actually print on the wafer, but generate the appropriate optical behavior that results in the intended features to print right. These techniques worked adequately, for example, at the 0.25 µm technology node.

At even smaller feature sizes (e.g., 0.18 µm), more sophisticated OPC techniques were necessary to compensate for pitch-sensitivity of patterns and diffraction effects. The two most common techniques are model-based OPC (MOPC) and rule-based OPC (ROPC), as illustrated in FIG. 6. In MOPC, the patterning process is modeled and simulated, based on which the likely printed pattern is predicted. Based on this, the layout is modified, and the simulation is performed again. This iterative process is repeated until the predicted pattern converges to the intended layout pattern. The difficulty with this approach is that it is iterative in nature and takes long computation times.

In ROPC, rather than rely on modeling and simulation, empirical data is obtained by measuring the actual results from the patterning process, and the appropriate mask CD required to produce a desired target wafer CD are determined. Once such "look up tables" are generated for a range of process conditions, the layout features on the mask are heuristically pre-compensated in order to achieve the target results on the wafer.

While these prior art techniques improve the patterning accuracy and CD uniformity, CD variations today remain intolerably high, both within an IC chip and across a stepper field, and will become increasingly more problematic at 0.13 µm and finer feature sizes. These CD variations are broadly categorized as across the chip line-width variabilities (ACLV) and across the reticle field line-width variabilities (AFLV). As the lithographic process advances from 248-nm to 193-nm stepper technologies and beyond, ACLV/AFLV problems will continue to get worse. Significant portions of these variabilities are as a result of systematic variabilities from the patterning process itself, which includes both the process steps, and the tools that are used in each step (e.g., mask writer, stepper/scanner, etcher, chemical-mechanical polishing (CMP) equipment).

One of the reasons the prior art techniques still leave a sizable portion of the image distortions uncorrected is that they assume that these distortions are fixed across the entire chip as well as the stepper field. This assumption is in fact far from reality. Furthermore, they are designed for general applicability and do not take into account the specific tools- or process-induced aberrations and their unique variability signatures. As illustrated in FIG. 6, the actual behavior of the physical tools and processes is reflected by linewidth variations across a reticle field, which is not effectively dealt with by prior art RET. In MOPC, the modeling does not adequately factor the within-field variations. In ROPC, the mask CD selected to produce a target wafer CD is not a constant number that can work for all field locations.

Therefore, what is needed is a correction method that is performed on a location specific, reticle-wide scale, for a specific tools/process combination, such that, e.g., distortions that are unique to a particular tools/process and are reticle-field-location dependent due to projection lens aberrations, can be fully compensated for.

Furthermore, vendors sell optical proximity correction software to manufacturers of semiconductor devices. Manufacturers are responsible for the increasingly-complex task of obtaining necessary characterization data to calibrate their optical proximity correction models and using such models on these software tools to correct customers' IC layout to account for proximity effects. Regardless of the scope of implementing OPC corrections, may it be for the 180 and 130 nm generations or prior generations or more state-of-the-art 90 and sub-90 nm generations, OPC and RET implementation is a very time-consuming process, and IC manufacturers are looking for more effective and efficient solutions.

SUMMARY OF THE INVENTION

The present invention provides a system and method of modifying the mask layout shapes of an integrated circuit layout design to compensate for reticle field location-specific systematic CD variations resulting from mask writing process variations, lens imperfections in lithographic patterning, and photoresist process variations, as illustrated in FIG. 7. Called PLC (Process-optimized Layout Compensation), each set of compensation rules according to the present invention is specifically tailored for a particular mask-writer-patterning-tools-and-resist-process combination, and are performed on a reticle-wide basis. Furthermore, for each geometric shape in the mask layout, the amount of modification is determined based on a categorization of the type of the shape, the specific location in the reticle field the particular shape falls in, its context (i.e., surrounding patterns, orientation, etc.), as well as certain photoresist parameters to be used in the patterning process.

As illustrated in FIG. 8, the PLC system consists of two major components: a tools/resist-process-specific part (the "characterization" phase), which is conducted for each individual specific mask-writer-patterning-tool-and-etch-step or a combination of steps, to generate a unique set of correction strategies, models and rules; and a design/device-specific part (the "applications" phase), which is performed for each integrated circuit device, leading to a PLC mask that optimally corrects the specific process and tool aberrations to produce superior patterns on the wafer. As illustrated in FIGS. 9-11, the PLC corrections can be applied in a number of ways, either before, during, after, or instead of, prior art RET applications. FIG. 12 illustrates a typical example of how PLC is applied at the level of individual layout shapes. Finally, FIG. 13 shows a PLC mask can be optimized for use on multiple steppers.

In another embodiment, a business process is provided for offering a turnkey service to semiconductor manufacturers to carry out compensation of lithography mask data for imperfections in the patterning process and to carry out other RET methodologies. The provider of such turnkey service preferably owns and takes total responsibility for implementing the layout compensation task and provides customers with data for manufacturing masks that will lead to further efficiencies and superior patterning accuracy and fidelity.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s).

DETAILED DESCRIPTION OF AN EXEMPLARY EMBODIMENT OF THE INVENTION

Figure 1:
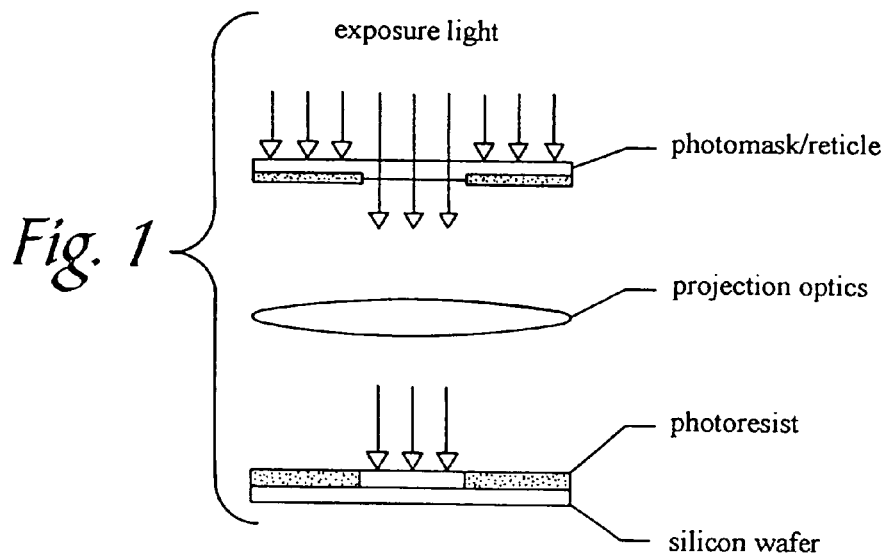
FIG. 1 is a schematic view of the optical lithography process.
Figure 2:
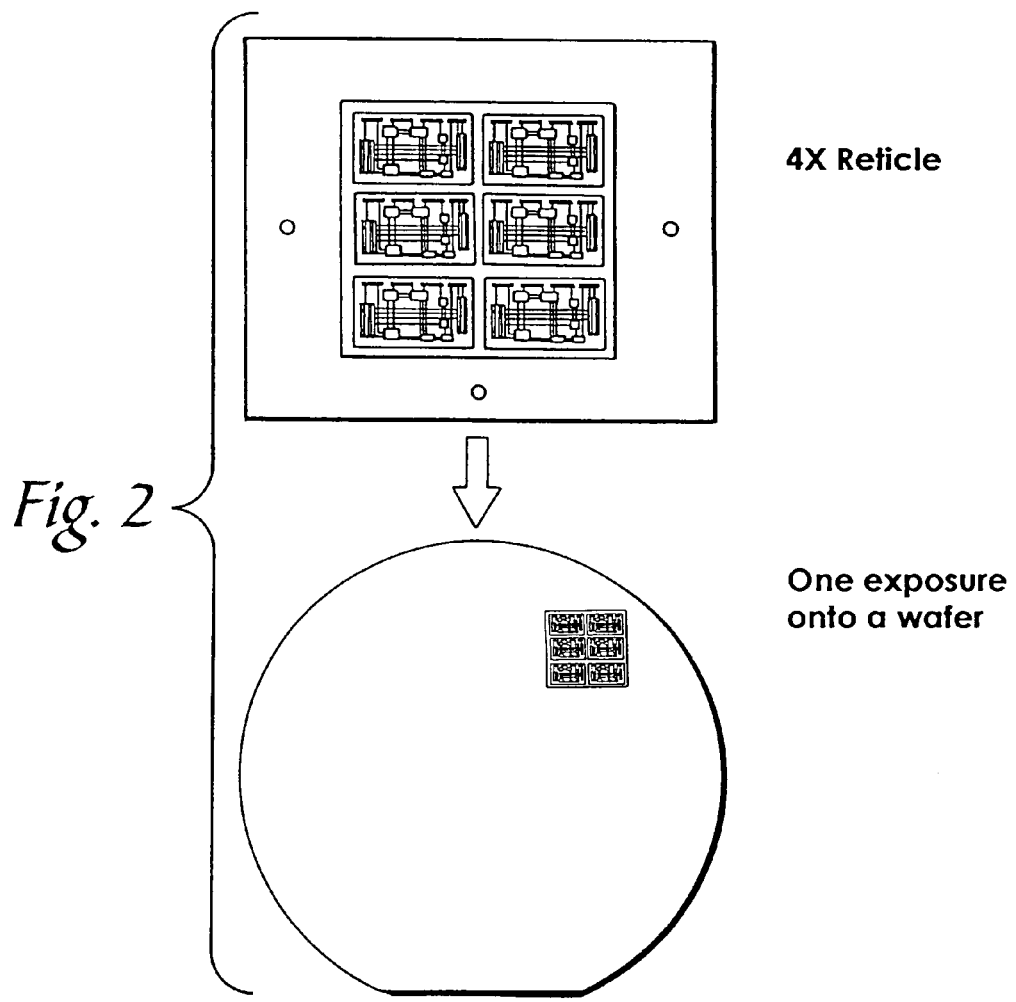
FIG. 2 illustrates the step-and-repeat or step-and-scan transfer of an image on reticle onto a wafer.
Figure 3:
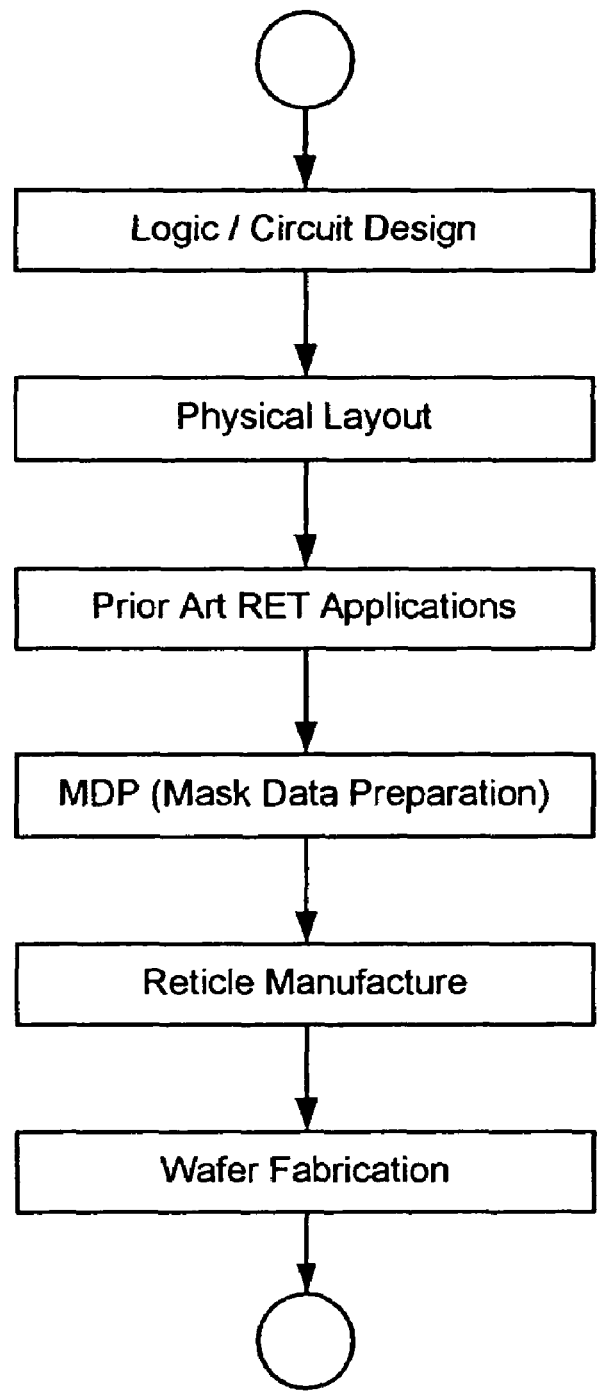
FIG. 3 shows a chip design-to-production process flow employing prior art RET techniques.
Figure 4:
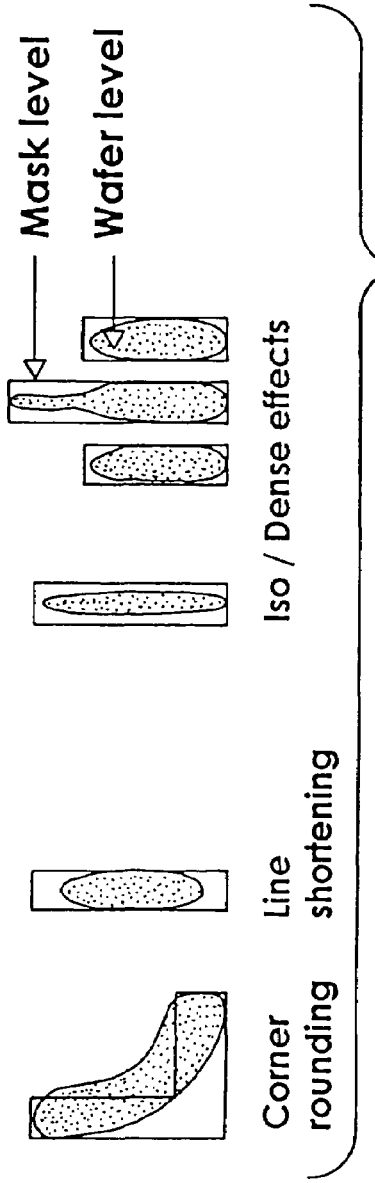
FIG. 4 shows various types of image distortions.
Figure 5:
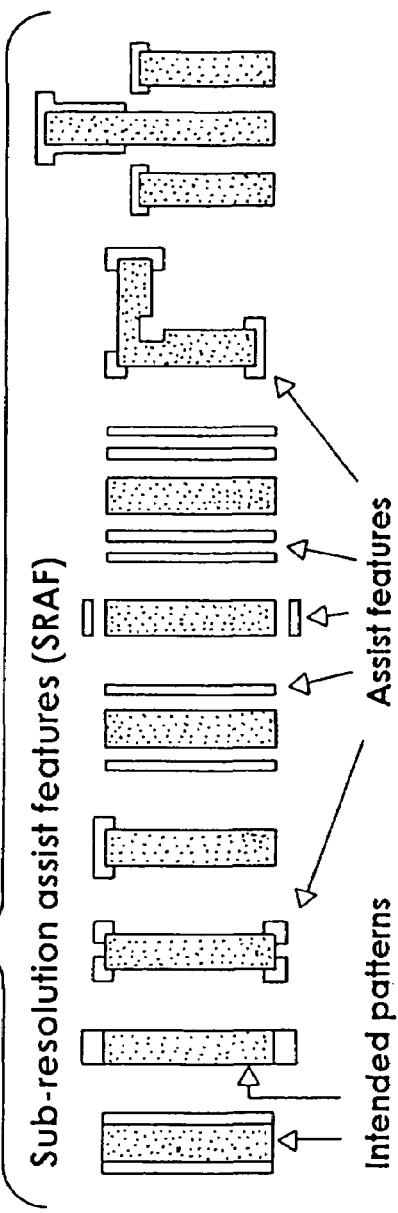
FIG. 5 illustrates some prior art image distortion correction techniques.
Figure 6:
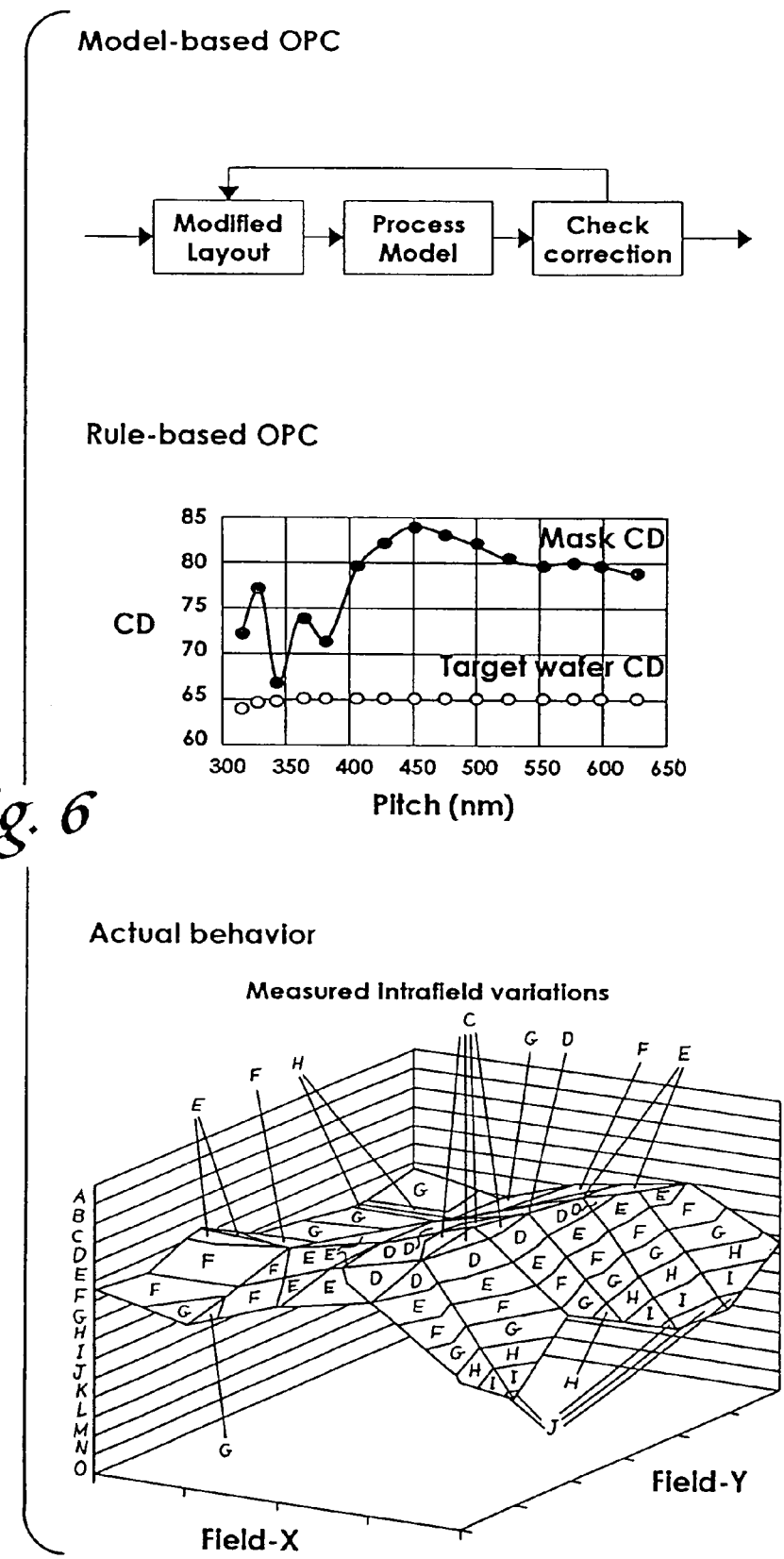
FIG. 6 illustrates the current state of the art in prior art image distortion techniques.
Figure 7:
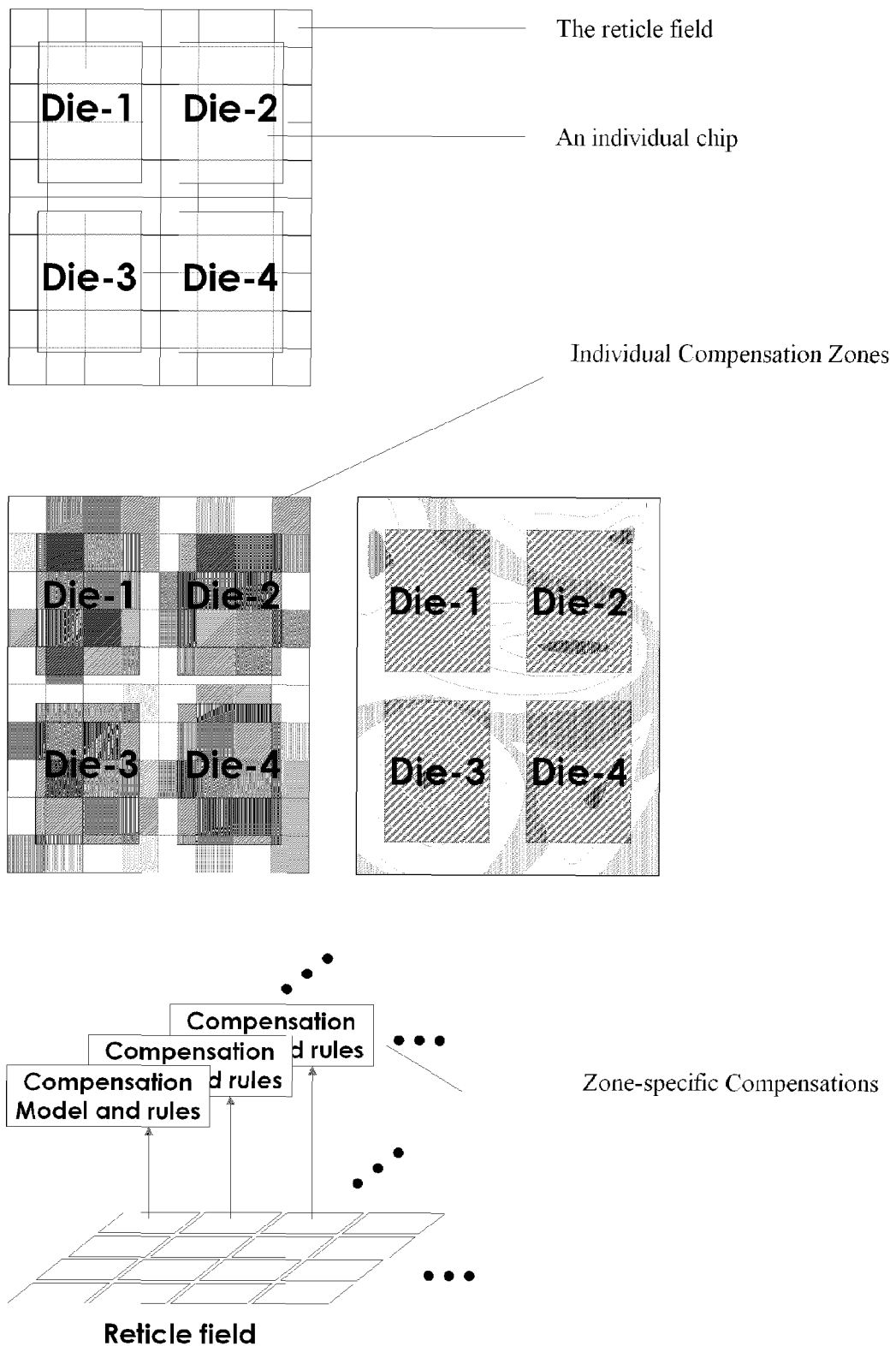
FIG. 7 illustrates the reticle-wide corrections according to the present invention.

Referring now to FIG. 7, there is shown the level of layout compensations as provided by the present invention. Starting from a rectangular reticle field, a set of correction zones is first mapped onto the field. The correction zones follow the natural tool/process-induced regions of aberrations. For practical purposes, these complex aberration regions may be reduced to a set of regions with more regular geometrical shapes, such as a grid of rectangular partitions of the same or varying sizes that are sufficiently small that within each such grid, the properties of the aberrations may be described in simpler mathematical terms. Each such partitioned space is called a Compensation Zone, where a zone is intended as the unit of application of the corrections. In the description here, for the sake of simplicity, a rectangular grid of compensation zones is assumed. As the patterning is done on an entire reticle field basis, zoning allows the peculiar local variability characteristics of a particular patterning system to be more fully exploited in the compensation process. All layout shapes that fall within a zone are to be corrected according to one common set of compensation rules, and such rule sets may vary from one zone to another.

Given the layout design of an integrated circuit, the master image of the layout will be arrayed (after applying the appropriate compensations) onto the reticle field. Depending on the actual dimensions of the chip in question, the number of such arrayed image copies may range from a handful to possibly tens or more. In this arraying process, one copy of the master layout image may end up straddling multiple compensation zones. In that case, two otherwise nominally identical layout shapes may need to be compensated differently if they fall into different zones. Furthermore, different copies of the master image, as they are arrayed on top of multiple compensation zones, will be compensated differently to more fully account for the local, location-specific variabilities.

Figure 8:
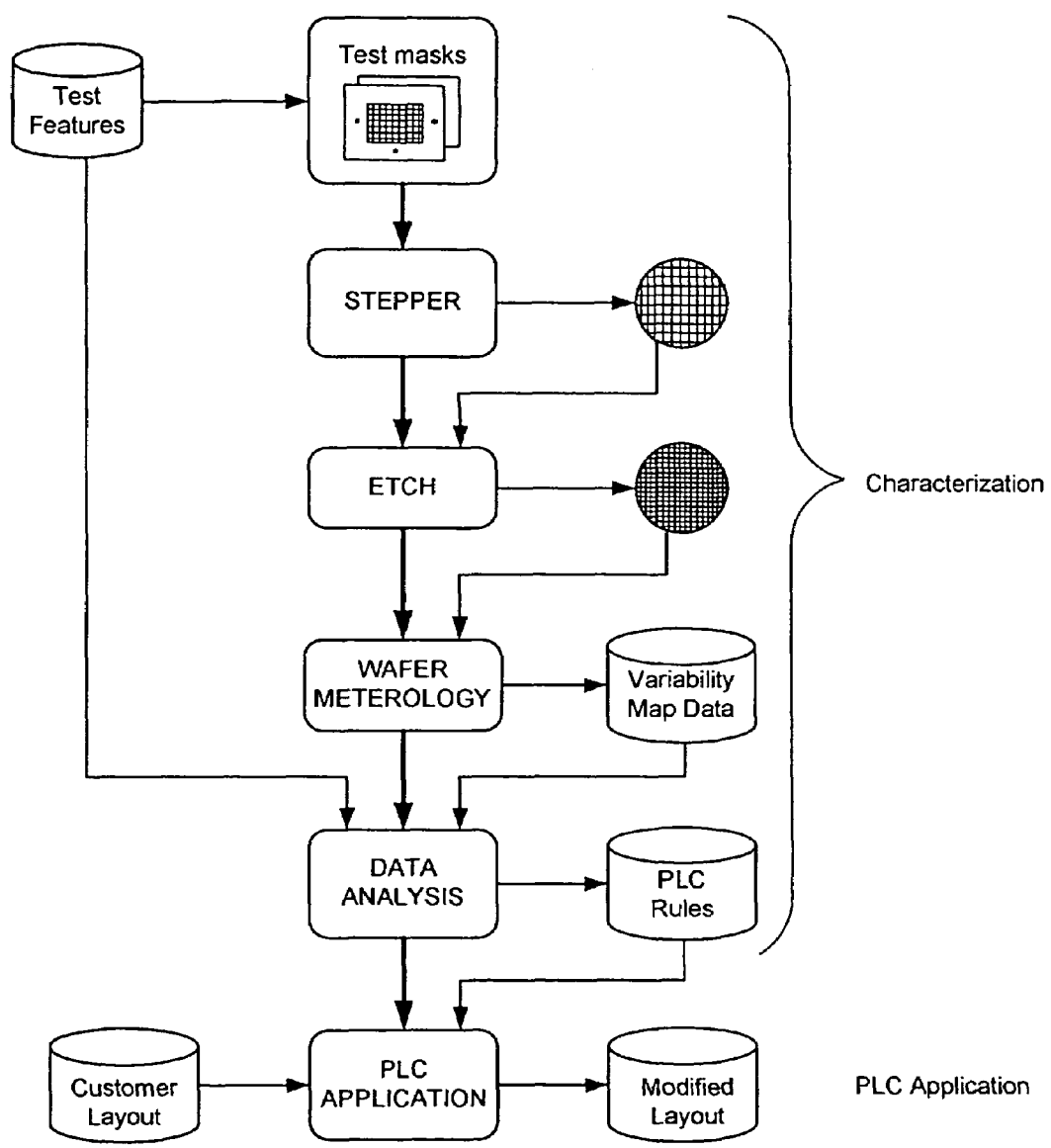
FIG. 8 shows the overall process flow of the present invention.

Referring now to FIG. 8, there is shown the overall process flow of the present invention. The main task of the characterization part is to extract a systematic variability signature that is unique to a tools/photoresist-process combination that may be used to pattern a critical layer during the manufacture of an integrated circuit. To accomplish that, a set of specifically designed test reticles (masks) is first used with the particular tools and resist process to pattern a number of test wafers. Each test reticle contains a large collection of layout shapes of varying characteristics (different orientations, sizes, densities, . . . ), designed and configured in such a way that the unique variability signature of the tools/resist-process combination will manifest itself in the patterns as printed on the resulting wafers. These test reticles incorporate collections of test features designed specifically for each wafer fabrication facility ("fab") and its design rules to allow for the extraction of the systematic variability signature of a particular patterning process. These characterization reticles are used to pattern a number of test wafers, using the target stepper and employing a range of process parameters that are likely to be used at the subject fab for the target development and etch processes. The wafers then undergo certain metrology measurements, resulting in a database of as-designed and as-printed feature sizes for various layout shape and pattern types. These measurements will be made within the reticle field of all the wafers, in multiple fields, within a wafer across all the wafers, and within multiple wafers to capture "wafer-to-wafer and lot-to-lot" variabilities.

The data is then analyzed to both statistically and physically decompose the patterning variability into systematic components and random components. The random components are stochastic in nature and are best addressed through statistical process control techniques. The systematic components, on the other hand, are unique to the particular tools/resist-process combination, are relatively stable, and are correctable through mask layout compensation. The systematic CD component basically embodies the unique variability signature of the particular patterning process, from which a set of compensation rules is derived. The end result of the data analyses is a unique variability signature of the particular tools/resist-process combination. From the signature, a set of PLC compensation strategies, models and rules for modifying the IC layout is generated.

Figure 9:
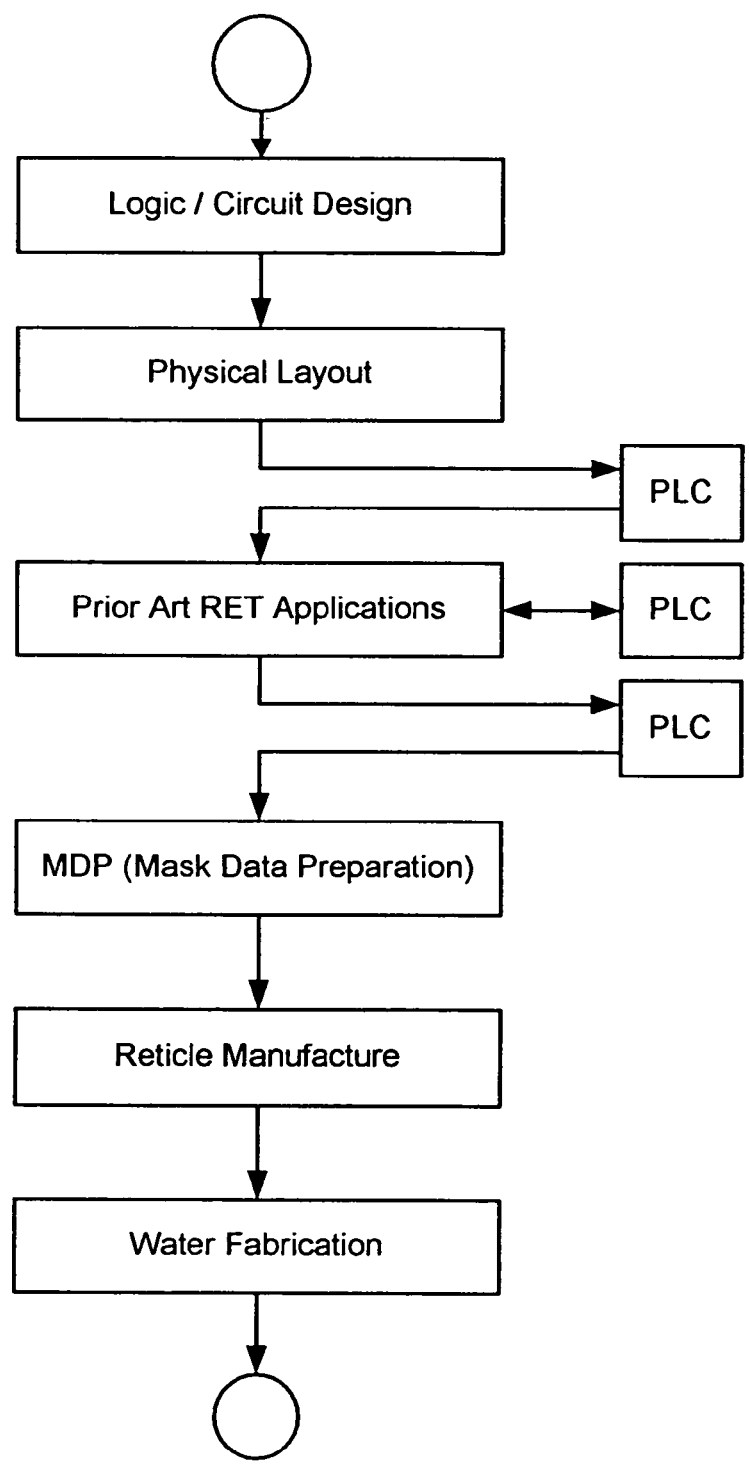
FIG. 9 shows the various ways of applying the present invention in the RET flow.
Figure 10:
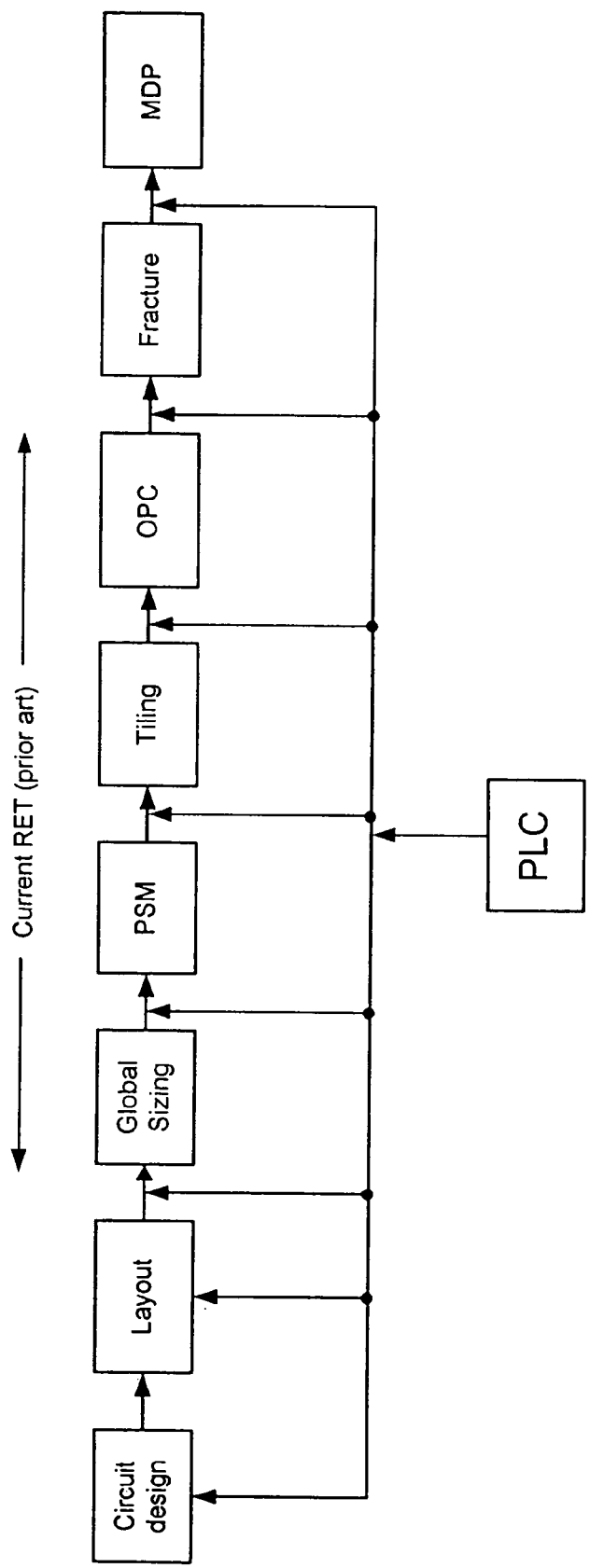
FIG. 10 shows the chip design-to-production process flow employing prior art RET and PLC.
Figure 11:
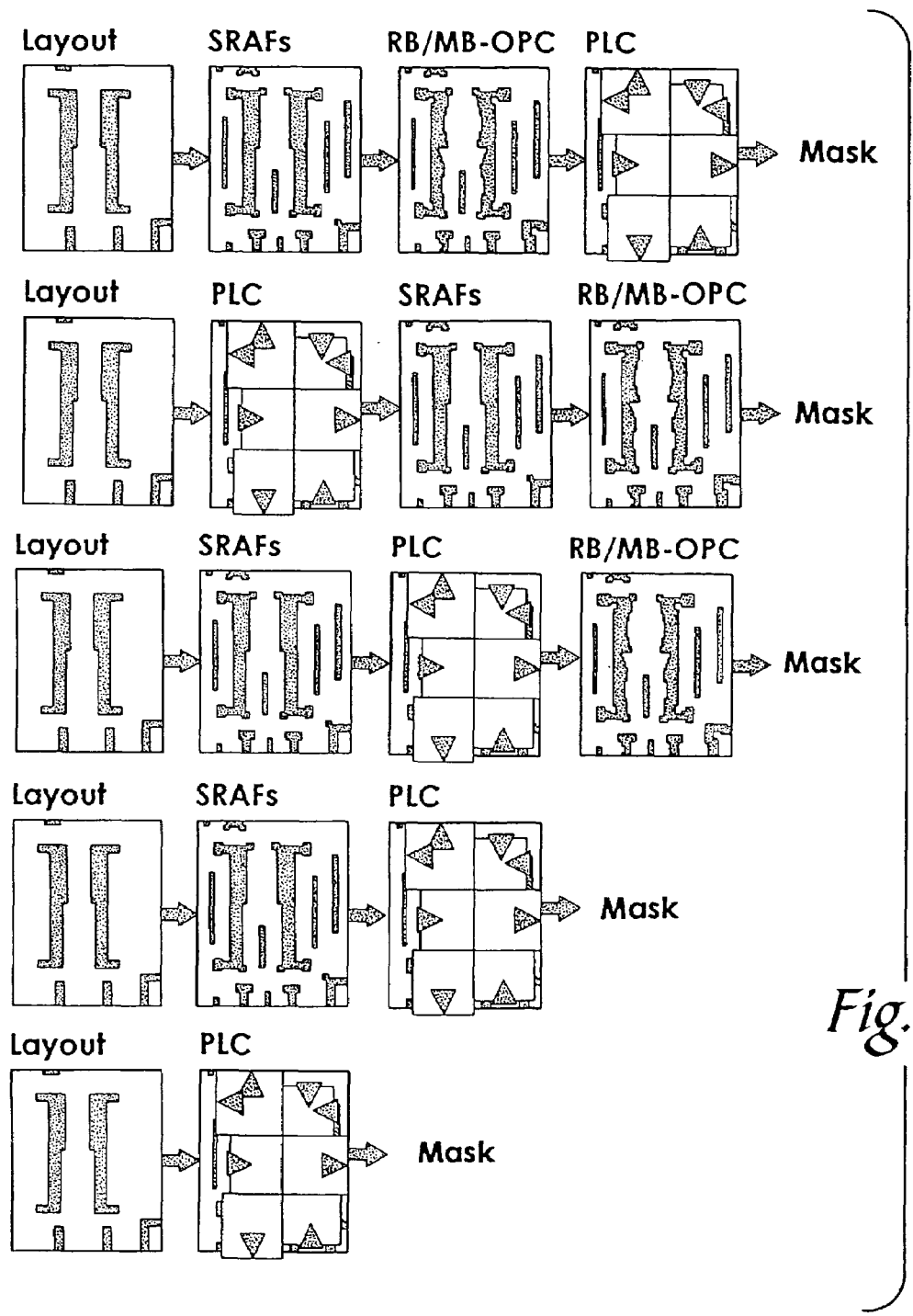
FIG. 11 shows some illustrative examples of the concept shown in FIG. 10.

Referring now to FIG. 9, the application of PLC can be made at several points during the design/tapeout flow. FIG. 10 illustrates this in greater detail, beginning with circuit design through MDP prior to physical mask production, and FIG. 11 illustrates some more specific examples of how PLC can be applied. At each stage of a typical tapeout process, the design/layout data is subject to specific treatments to achieve certain desired results. In the applications phase, the techniques of the present invention are applied to each critical layer of a chip design, following the process flow shown in FIG. 12. These techniques may be applied prior to, during, or subsequent to, or instead of, the application of the prior art RET techniques. The optimal point of PLC application is determined based on individual needs of a particular IC designer or fab.

The applications phase of the present invention applies the corrections to the layout shapes of an IC according to the compensation rules. More particularly, for an individual chip design, there are a number of layers for which precise CD control and high CD uniformity will have a major impact on the chip's speed performance (so-called "binning") and production yield. These are called the "critical layers" of the particular IC layout design. The potential economical ramification gives an IC manufacturer the incentive not only to process such critical layers using the most advanced mask-making and lithographic tools, but also to run the layout data for these layers through the PLC process. The additional PLC processing of a layer's layout data may come before, during, or after the application of the prior art RET techniques. The layout data as modified by the PLC applications process is then used to make the "PLC-masks," which are used in the patterning of the critical layers of the IC.

For a given critical layer of the said IC, the layout data is typically represented in the form of a CAD database file. Today, the GDS-II format is widely used in the industry, and therefore, GDS-II is used in description here, but the method described here equally applies to any other CAD system's data format, or XML-based or other data representations. Typically multiple instances will be mapped onto a reticle field. In so doing, each instance will be overlaid on different compensation zones. For each instance of the master layout image, a job partition is created. Such partitioning could also be accomplished by correction zones, depending on the size of the chip vis-à-vis the size and number of correction zones.

Figure 12:
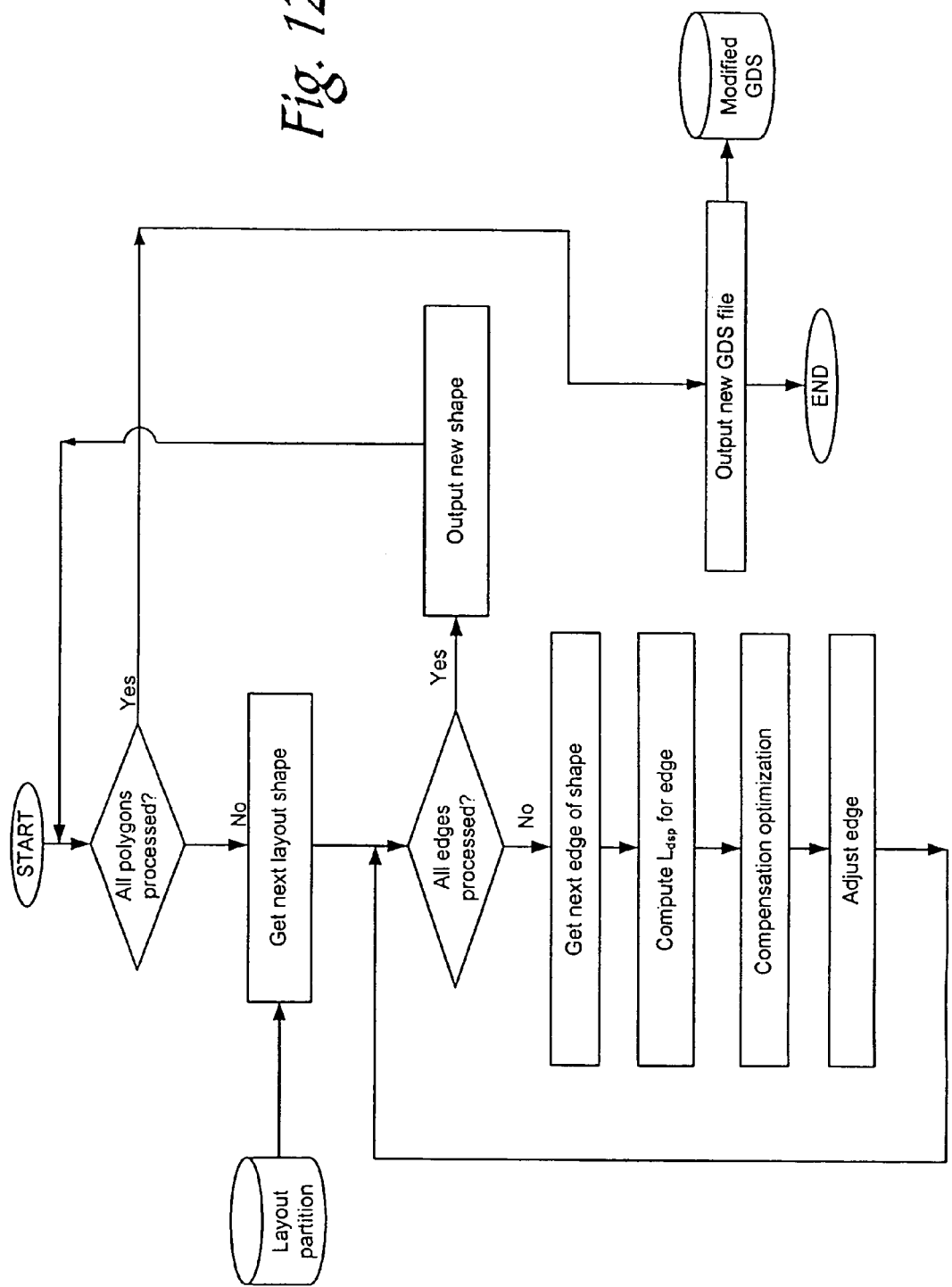
FIG. 12 shows the flow of a PLC application process.

For each job partition, the process shown in FIG. 12 is performed in which each layout shape contained in the GDS file is retrieved and modified according to the compensation method of the present invention. The output is a corrected GDS file for the particular job partition.

Because the processing of different partitions is independent of each other, the whole job may be divided among a collection of processing nodes, to reduce the overall turn-around time. The final result is the layout images for the entire reticle field, which is then used to make a PLC reticle, for use in the patterning of the particular layer.

Figure 13:
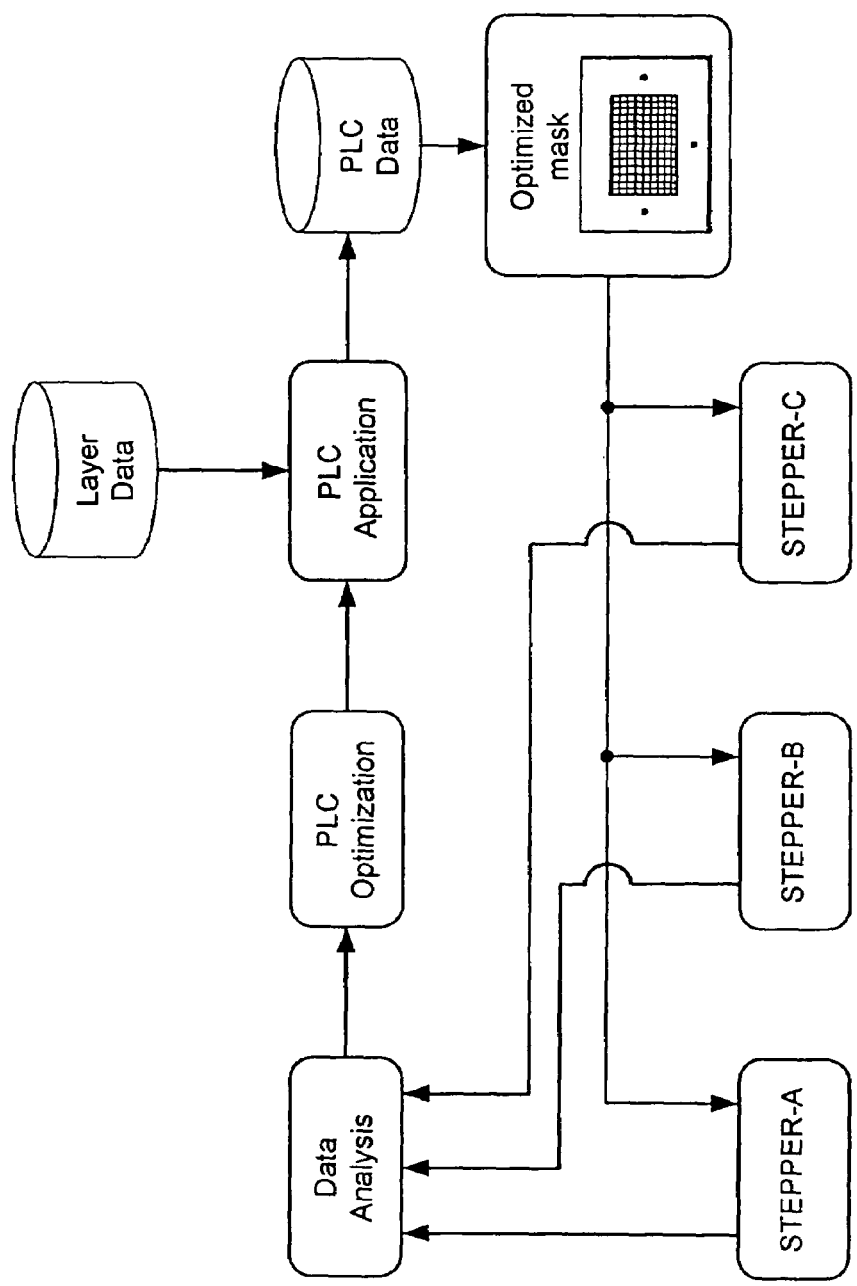
FIG. 13 shows a PLC mask may be optimized for use with multiple steppers.

Referring to FIG. 13, the PLC application can also be optimized for operation with multiple steppers. This is accomplished by analyzing the signature of each target stepper and identifying components that are both similar and dissimilar. These are used to generate PLC strategies, models and rules for generating optimized masks that can work well with any of the steppers. The optimizations can be further fine-tuned based on user-specifiable weighting factors for expected usage. Such optimization enables a fab to use any stepper in a fab so that the use of a PLC mask does not restrict usage to only one stepper. Such optimization also makes it possible to get the best possible patterning results with a PLC mask on one stepper, for example, while getting acceptable results on other steppers that may be used as emergency backup systems.

Business Process for Turnkey Solution

In another embodiment, a method and business practice for a customer to outsource post-layout data modifications is provided. In this method, an entity that is run independently of a customer, a fabrication facility, and a mask shop obtains a layout design from the customer. The entity then modifies the layout design and returns the modified layout design to the customer, fabrication facility, and/or mask shop. The modification can be based on process and equipment conditions at the fabrication facility and/or mask shop. Additionally, some or all of the modifications can be independent of the process and equipment conditions at the fabrication facility and/or mask shop. For example, some layers of the layout design can be modified using OPC models that do not require, as input, processing and equipment conditions at the fabrication facility and/or mask shop, while other layers are modified based on such process and equipment conditions. In another embodiment, instead of merely returning the modified layout design, the entity makes a mask that incorporates the modified layout design and provides the mask to the customer and/or fabrication facility. These and other embodiments are described in more detail below.

Figure 14:
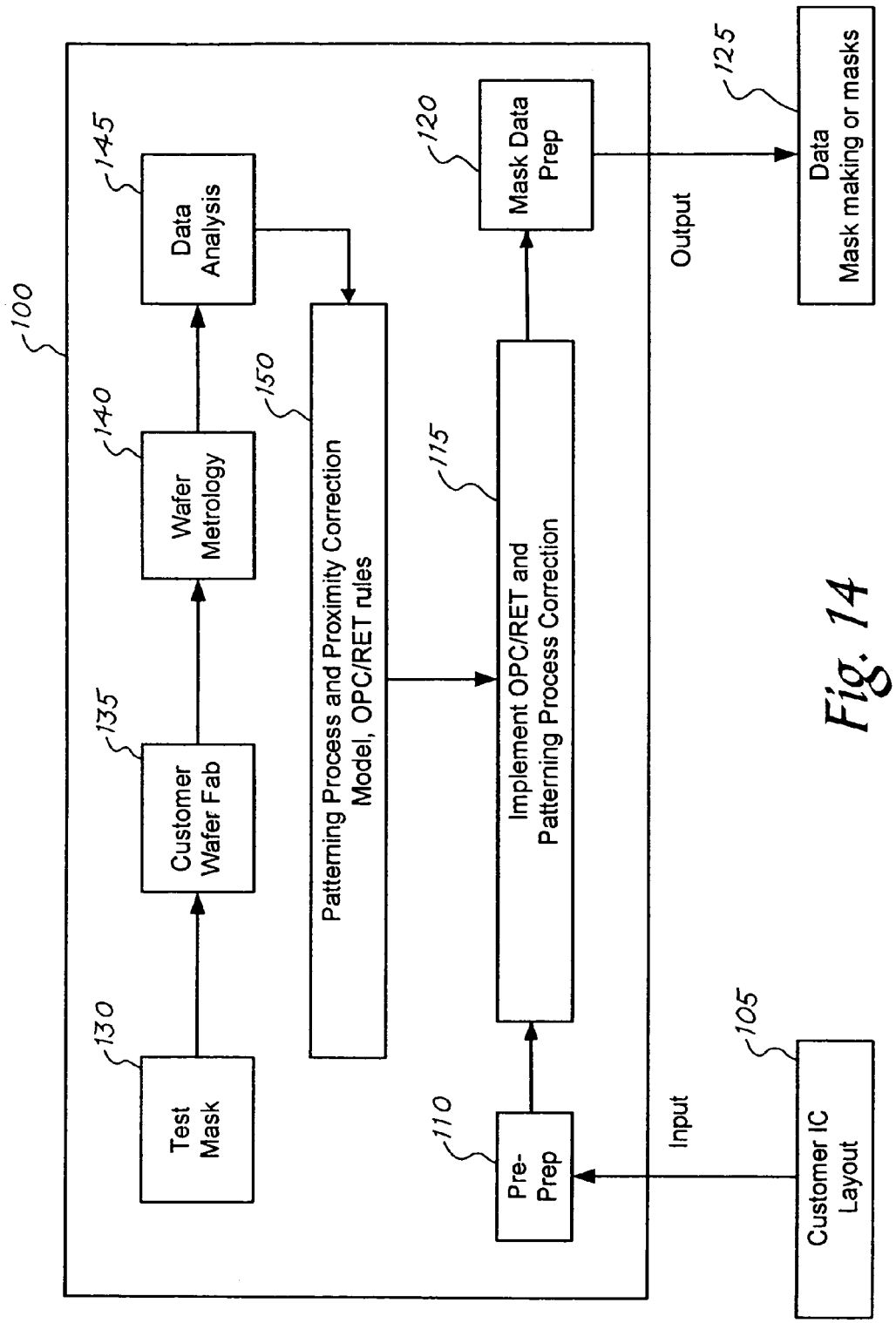
FIG. 14 shows a typical flow chart for data flow for implementing OPC and patterning process corrections and components for a turnkey business process.

Referring to FIG. 14 along with FIG. 10, the schematic flow diagrams show the various steps in implementing corrections to the IC layout to account for patterning tool and process effects and other RET implementations. Sometimes, the whole operation may be limited to simple OPC such as with sub-resolution assist features or SRAF's such as serifs, hammerheads, corner cutouts, and scattering bars.

As shown in FIG. 14, an entity 100 receives an IC layout from a customer 105. After a pre-preparation step 110, OPC/RET and patterning process corrections are implemented 115 to modify the layout and prepare modified mask data 120. The mask making data or the masks themselves 125 are then provided to the customer, a fabrication facility, and/or a mask shop. FIG. 14 also shows the steps to determine the patterning process corrections. First, test masks 130 are prepared, and wafers 135 are fabricated. The wafer undergoes wafer metrology 140, and the resulting data is analyzed 145 to produce a patterning process and proximity correction model and/or OPC/RET rules 150.

Figure 15:
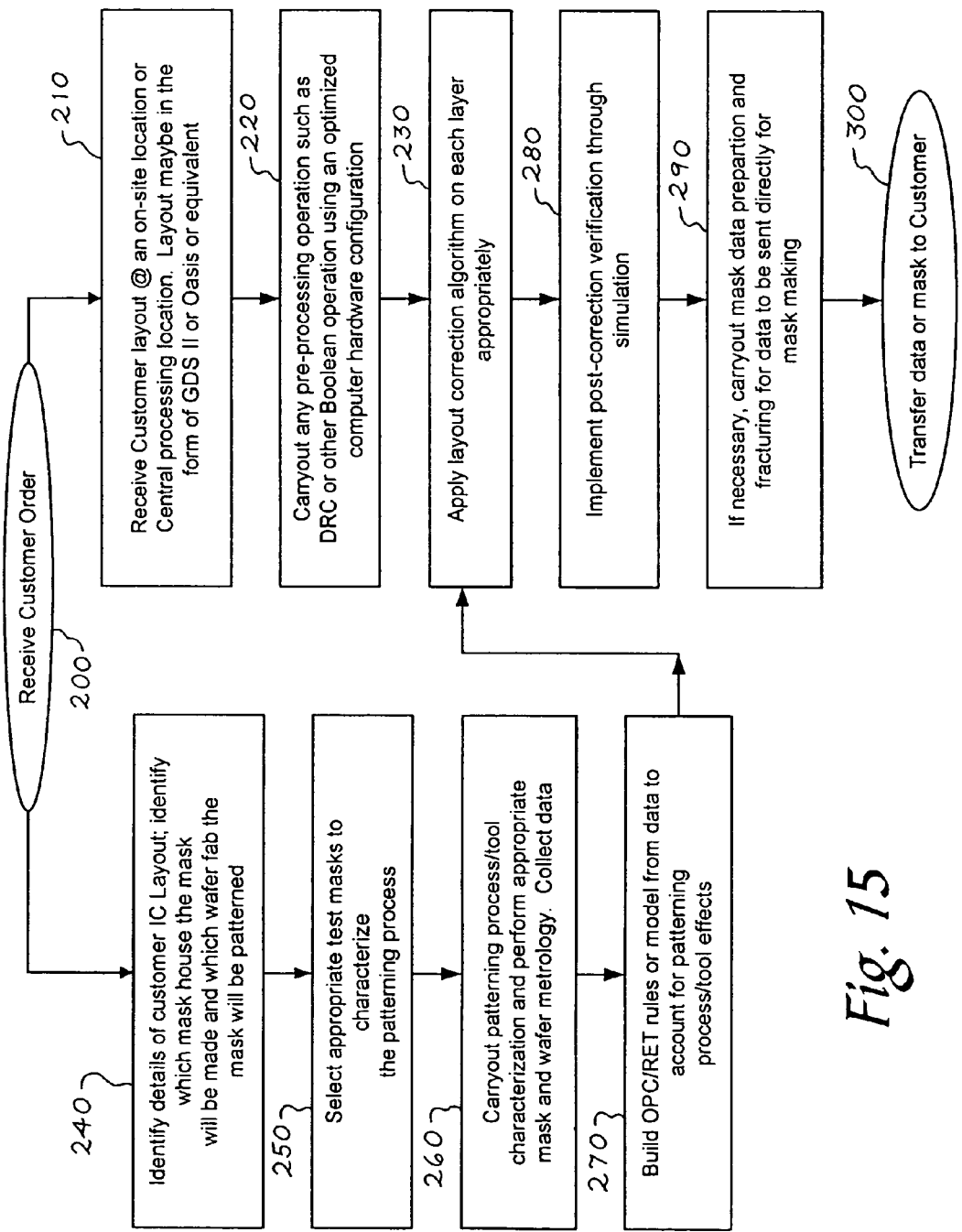
FIG. 15 illustrates the various steps and operations that can be used to provide customers with a total turnkey solution.

FIG. 15 is a more detailed step-by-step explanation of the entire turkey service process. First, the entity receives a customer order (act 200). The entity receives the customer layout at an on-site location or a central processing location (act 210) and carries out any pre-processing operations (act 220). Next, the entity applies a layout correction algorithm on each layer (act 230). The layout correction algorithm preferably is based on process and equipment conditions at a fabrication facility and/or mask shop. To create the algorithm, the entity identifies details of the customer IC layout and identifies which mask house will make the mask and which wafer fabrication facility will pattern the mask (act 240). Next, the entity selects the appropriate test masks to characterize the patterning process (act 250). The entity then carries out the patterning process, characterizes the tools used, performs the appropriate mask and wafer metrology, and collects the resulting data (act 260). From this data, the entity builds OPC/RET rules or a model to account for patterning process/tool effects (act 270).

After the entity applies the layout correction algorithm on each layer (act 230), the entity implements post-correction verification though simulation (act 280). If necessary, the entity can carry out mask data preparation and fracturing for data to be sent directly for mask making (act 290). The entity 100 then transfers data or the mask to the customer (act 300).

More generally, upon negotiating the scope of the project, customers would provide data on their IC design and layout as well as their choice of wafer fab where they intend to print the masks. Often times, the first element of this process is quantitative characterization of the patterning tools and process. Characterization is preferably done at the wafer fab by printing a multitude of test patterns and measuring features of the patterns formed on the wafers. The next step is preferably either generating rules or fitting a model to these observations. Once this is completed, the rules or model can then be applied to the layout.

The IC layout is typically in a GDS II or Oasis or equivalent format. As part of the turnkey service, both design rule check (DRC) operations as well as layer polygon operations including but not limited to Boolean and pre-biasing operations can be performed. Patterning process/tool and proximity corrections are then applied to the layout. As the last step, post-correction verification of the layout and mask data preparation are completed. At this point, the data can be transferred to the customer for mask making or, as part of the turnkey service, a mask set can be made for the customer specific to its design and wafer fab.

This flow can also address other operations such as phase shifting masks (PSM) as well as tiling operations to compensate for chemical mechanical polishing effects on the wafer. For any given customer, there may be specific non-critical layers for which rigorous position-dependent corrections may not be necessary. Regardless, more generalized chip-wide proximity corrections have to be made to the layout. If so, these operations fall well within the scope of the business process.

A set of resources including computers, software tools including in-house developed or commercially-available OPC and RET software, networking and data communications bandwidth, physical facilities, wafer test and metrology equipment, and people, including technical experts, operators, and administrative support personnel are preferably used to carry out the turnkey solution. Wafer fab characterization preferably involves having manpower onsite who will be responsible for collecting data and processing it on-site or sending the data to a central location for processing. Based on the characterization model created, IC layout modifications can be done at a central location or at a customer site using optimized computer system configuration and layout optimization software.

Figure 16:
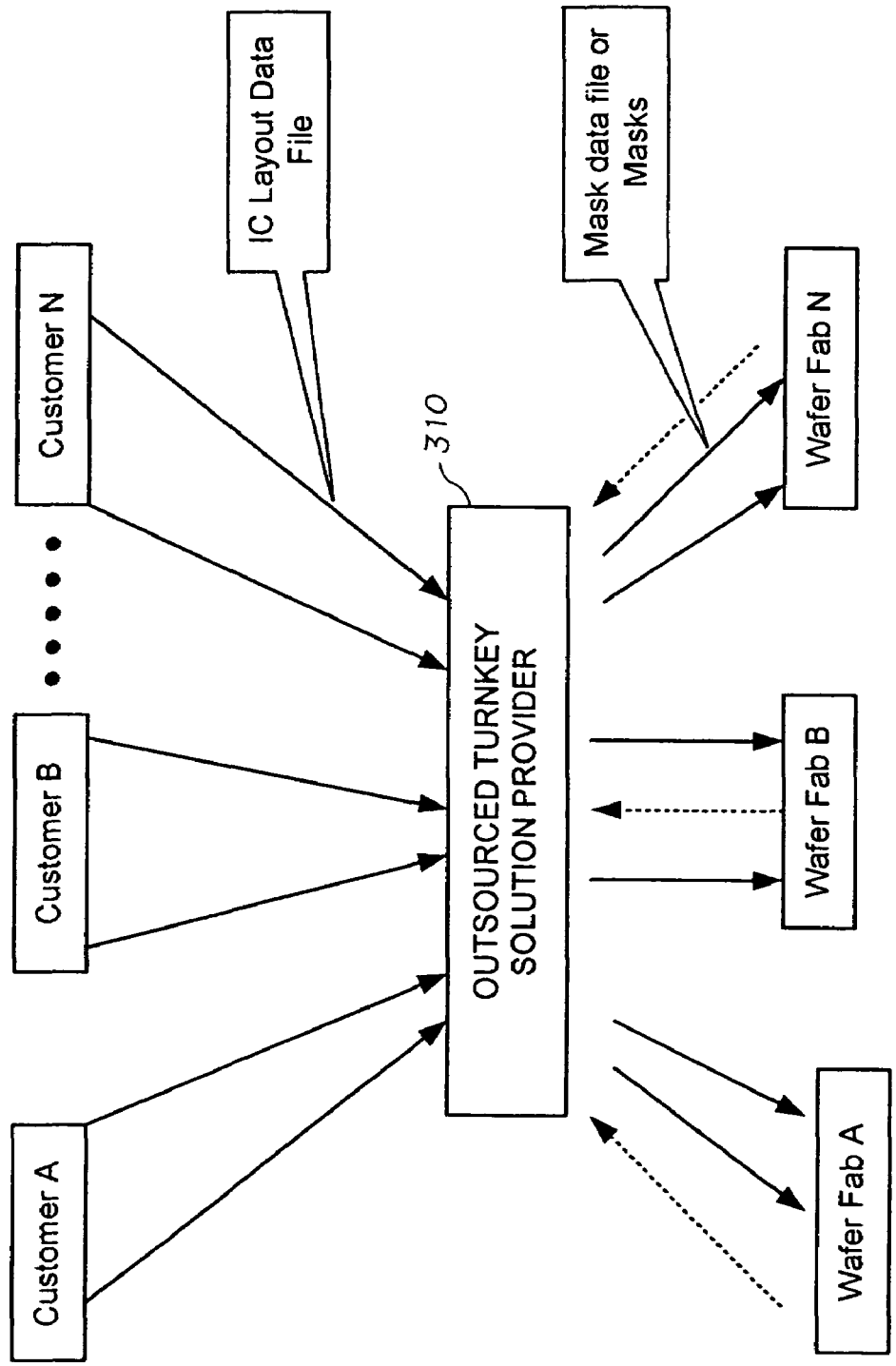
FIG. 16 is an example of maximizing efficiency using shared resources typical of outsourcing.

Customers are thus offered a comprehensive turn-key solution. The integrated turnkey solution includes service and support that can be offered on an on-going basis for various design layouts and the manufacturing process used by the manufacturers of ICs. In particular, the business process can comprise a set of shared resources consisting of computers, software tools including commercially-available reticle enhancement (RET) software, networking and data communications bandwidth, physical facilities, wafer test and metrology equipment, and people, including technical experts, operators, and administrative support personnel, that can be optimized for any given customer who has a plurality of operations, or, shared amongst a plurality of customers resulting in operational efficiencies. This business process where a plurality of customers shares common resources to achieve operational efficiencies is akin to outsourcing. This is elaborated in FIG. 16. As shown in FIG. 16, an outsourced turnkey provider 310 receives IC layout data files from a plurality of customers (Customers A-N) and information regarding process and equipment conditions from a plurality of wafer fabrication facilities (Wafer Fab A-N). In this scenario, the bulk of the data management, modeling efforts, and layout corrections can be done at a common location/locations that offer less-expensive manpower.

The business model may further include any combination of the following: on-site support at a customer site for periodic characterization of customer patterning process; completing all characterization measurements on wafers at common location/locations using standardized metrology tools of known precision and accuracies; electronically or otherwise transferring such characterization information from a single or multiple locations to common location/locations for extraction of tool signature and generating compensation rules or models; electronically or otherwise obtaining customer/customers IC layout design for each layer to common location/locations; modifying the geometric shapes of the layout using the set of compensation rules, to obtain a corrected layout using common multi-tasking computer farm/farms; and electronically or otherwise transferring modified IC layout design back to customer/customers designated location/locations.

While the invention has been described in terms of a single exemplary embodiment, those skilled in the art will recognize that many further variations are possible. Consequently, the invention is intended to embrace all variations and modifications that fall within the spirit and scope of the appended claims.

The following system and method examples and variations were originally presented as part of the disclosure, but in claim format, in the above-referenced provisional application:

System Examples and Variations

A system for reducing CD variability in lithographic patterning in the manufacture of an integrated circuit may comprise the steps of characterizing a system and/or process, generating compensation rules, correcting according to such rules, making a compensated reticle/photomask using the corrected layout data, and using the compensated reticle to pattern an IC. Specifically, the characterization step involves characterizing a specific mask writing system, optical projection system, photoresist process, and etch process to obtain a unique variability signature pertaining to that particular tools/patterning-process combination. The generating compensation rules step involves generating a set of PLC compensation rules from the unique variability signature. The correcting step involves applying reticle field-wide PLC corrections, for any target layer of said IC layout design, by modifying the geometric shapes of the mask layout according to the set of compensation rules, to obtain corrected layout data for the entire reticle. The PLC reticle/photomask is made on the specific mask writing system using the corrected layout data. The PLC reticle is used to pattern the particular target layer in the manufacture of the integrated circuit.

In addition, the system described above may also comprise generating characterizing reticles, patterning test wafers, taking measurements to create a database, analyzing the database, and generating compensation rules. More specifically, the generating step comprises generating a plurality of characterizing reticles containing a plurality of layout features for the purpose of capturing the unique variability signature of a specific patterning process using a specific mask writing tools/optical tools/resist process combination. The patterning step comprises patterning a plurality of test wafers using the characterizing reticles, through the specific patterning process. The measurement step involves performing metrology measurements of the CD's on both the characterizing reticles, the developed wafers, and the etched wafers, to generate a database of variability map data. The analyzing step involves analyzing the variability map database to generate the unique variability signature of the specific patterning process. A set of PLC rules are generated for the specific patterning process based on the unique variability signature.

The characterizing reticles may contain: appropriate design to represent the actual device layout and fab design rules vis-à-vis appropriate CDs, pitches, densities as well as isolated and dense patterns and pattern directions; appropriate probing structures for electrical line width measurements; and appropriate structures for measurements by CD-SEM (scanning electron microscope), optical scatterometry and cross-section SEM and TEM.

In addition, the metrology measurements process can also include the steps of: measuring CD's on the characterizing reticles using CD-SEM or scatterometry to generate a portion of the data for the variability map database; measuring CD's on the developed test wafers using CD-SEM to generate yet another portion of the data for the variability map database; performing electrical linewidth measurements (ELM) on the etched test wafers to generate further data for the variability map database; and performing measurements on pre-calibrated metrology tools that have used standardized calibration wafer sets.

The variability map database analysis process can also include the steps of: organizing the database appropriately for extraction of statistical (stochastic) components and deterministic (signature) components; performing statistical decomposition to extract the systematic/deterministic signature from the variability data using Discrete Fourier Transforms; performing physical/causal decomposition of the deterministic signature through formulation of a collection of linear regression fitted transfer functions of the patterning tools.

Moreover, the derivation of PLC compensation rules can also include steps directed to generating correction zones and generating compensation rules for each such zone.

Specifically, generating the correction zones can involve generating an optimal number of correction zones such that (a) the correction zones are defined by regular geometric areas, such as rectangles, that facilitate selection of a cluster of layout patterns that fall within the correction zones; (b) the number of correction zones are a function of the degree of intra-field variabilities as well as the desired level of corrections; and (c) within each such correction zone, the variabilities can be sufficiently simplified and mathematically represented in a manner that facilitates the generation of one set of compensation rules that can be applied in practice with great computational efficiencies. Generating compensation rules can involve, for each correction zone, a function of the feature size, pitch, density, orientation (vertical or horizontal); stepper settings such as focus, exposure dose, partial coherence and numerical aperture; and certain other process parameters in the resist and post-resist bake processes.

The process of applying PLC corrections to a particular target layer of the IC layout can also include partitioning. Specifically, the process can include reading in the reticle layout information and creating one job partition for each instance of the master layout image to be mapped onto the reticle field. Then, for each job partition, reading in the GDS layout data file of the target layer and applying the corrections to the layout data according to the PLC rules. This input layout in GDS, or another format, can be the output of a prior art RET process. The PLC can be applied prior to, during, subsequent to, or instead of a prior art RET process. Moreover, the application of PLC can be performed in a multiprocessing setting, either in a distributed configuration among a plurality of processor nodes connected through a network, or among multiple processors assembled within one node.

Method Examples and Variations

This section provides details of a method and business practice for implementing the system described in the first paragraph of the above section by the manufacturers of integrated circuits.

Turn-Key Solutions

Customers are offered a comprehensive turn-key solution for reducing CD variability and improving the accuracy of patterning in the manufacture of an integrated circuit. The integrated turnkey solution includes service and support for characterizing a specific projection optical system and photoresist process to obtain a unique variability signature pertaining to that particular tools/resist-process combination. This is offered on an on-going basis for all the patterning tools used by the manufacturers of integrated circuit. The business practice includes providing service and support to obtain a unique variability signature pertaining to that particular tools/resist-process combination based on the data obtained. It also includes providing service and support for deriving a set of compensation rules from the unique variability signature. Moreover, it includes service and support for each target layer of an IC layout design, including modifying the geometric shapes of the layout using the set of compensation rules to obtain a corrected layout. It also includes service and support for making a reticle/photomask using the corrected layout data, and for using the corrected reticle to pattern the particular target layer in the manufacture of the integrated circuit. In particular, the business would comprise a set of shared resources consisting of computers, software tools, networking and data communications bandwidth, physical facilities, wafer test and metrology equipment, and people, including technical experts, operators, and administrative support personnel, that can be shared amongst a plurality of customers, resulting in operational efficiencies to provide the above-described services.

The business model may further include any combination of the following: on-site support at customer site for periodic characterization of customer patterning process; completing all characterization measurements on wafers at common location/locations using standardized metrology tools of known precision and accuracies; electronically or otherwise transferring such characterization information from a single or multiple locations to common location/locations for extraction of tool signature and generating compensation rules; electronically or otherwise obtaining customer/customers IC layout design for each layer to common location/locations; modifying the geometric shapes of the layout using the set of compensation rules, to obtain a corrected layout using common multi-tasking computer farm/farms; electronically or otherwise transferring modified IC layout design back to customer/customers designated location/locations.

The PLC compensation rules generated can optionally be optimized for providing user-desired performance across a plurality of steppers based on user-definable weighting factors.

Method for Practicing Resolution Enhancement Technology (RET)

A method of practicing the Resolution Enhancement Technology (RET), through mask layout corrections on an entire-reticle-field-wide basis, in lithographic patterning in the manufacture of integrated circuits, can include characterizing a system, deriving and applying compensation rules, making a corrected reticle, and patterning. A specific patterning system is characterized, in its entirety, including the specific tools used and the process steps performed, to derive a unique variability signature of the specific system. Then, a plurality of compensation rules sets are derived from the unique variability signature. For each mask layout layer of an IC for which the application of RET is desired, corrections are performed, using the sets of compensation rules to generate a corrected layout data file(s) for the entire reticle field. Then, a corrected reticle is made using the corrected reticle field wide layout data. The corrected reticle is used to pattern the particular layer of the IC.

The rules sets can be constructed substantially in the form of multi-dimensional look-up tables of compensation factors for fast retrieval and expeditious execution, specifically without resorting to such time-consuming techniques as real-time optical or process simulations.

Moreover, the rules look-up tables can be keyed substantially by, but not limited to, such attributes of the layout shapes as the location in the reticle field, the size, orientation, and pattern density, and such tool settings and process parameters as the exposure dosage, the focus, and etch process parameter settings.

For certain critical circuitry, or at certain critical "hot spots" within either a single die or within the reticle field, more precise compensations can be computed based on localized optical and process simulations.

The original reticle may consist of a plurality of layouts that are not for exactly the same device, and PLC corrections are applied to these multiple devices on a reticle location-specific basis.

What is claimed is:

1. A method of compensating a target layout design for use in manufacture of integrated circuit devices, said method comprising:

deriving a systematic variability signature, on a full reticle field-wide basis, based on process and equipment conditions applicable to the manufacturing process, generating compensation models or rules from the systematic variability signature, wherein the effects of said models or rules encompass the whole reticle field and are field location dependent, and applying the compensation models or rules to the target layout design, in a field location dependent manner, to produce a compensated layout design, and wherein the process and equipment conditions are specific to a mask making stage of the manufacturing process, the target layout design describes the physical layout of a fabrication layer of multiple mutually adjacent instances of an integrated circuit design within a reticle field, the step of deriving the variability signature comprises dividing the reticle field into multiple compensation zones, whereby each compensation zone contains features of the target layout design, and the step of generating compensation models or rules from the variability signature comprises generating compensation models or rules for the compensation zones respectively.

2. A method according to claim 1, wherein the step of applying the compensation models or rules to the target layout design comprises applying each set of compensation models or rules to features of the target layout design contained within the respective compensation zone, whereby the compensated layout design describes a modified physical layout of the fabrication layer within the reticle field.

3. A method according to claim 1, comprising generating a reticle using the compensated layout design and patterning a fabrication layer of a wafer using said reticle.

4. A method according to claim 1, comprising receiving the target layout design from a customer.

5. A method according to claim 4, further comprising delivering the compensated layout design to the customer or to a manufacturing service provider.

6. A method according to claim 4, comprising delivering the compensated layout design to a mask manufacturer and wherein the mask manufacturer manufactures a mask including a reticle in accordance with the compensated layout design.

7. A method according to claim 5, comprising delivering the compensated layout design to a mask manufacturer and wherein the mask manufacturer manufactures a mask including a reticle in accordance with the compensated layout design.

8. A method according to claim 4, further comprising delivering the compensated layout design to the customer or to a manufacturing service provider.

9. A method according to claim 1, wherein the target layout design has multiple segments containing design features of respective integrated circuit devices and the method comprises applying the compensation models or rules to the design features based on the locations of the respective features in the reticle field.

10. A method according to claim 1, further comprising manufacturing a reticle in accordance with the compensated layout design and patterning a wafer using said reticle.

11. A method of compensating a target layout design for use in manufacture of integrated circuit devices, said method comprising:

deriving a systematic variability signature, on a full reticle field-wide basis, based on process and equipment conditions applicable to the manufacturing process, generating compensation models or rules from the systematic variability signature, wherein the effects of said models or rules encompass the whole reticle field and are field location dependent, and applying the compensation models or rules to the target layout design, in a field location dependent manner, to produce a compensated layout design, and wherein the target layout design describes the physical layout of a fabrication layer of mutually adjacent instances of multiple integrated circuit designs within a reticle field, the step of deriving the variability signature comprises dividing the reticle field into multiple compensation zones, whereby each compensation zone contains features of the target layout design, and the step of generating compensation models or rules from the variability signature comprises generating compensation models or rules for the compensation zones respectively.

12. A method according to claim 11, wherein the step of applying the compensation models or rules to the target layout design comprises applying each set of compensation models or rules to features of the target layout design contained within the respective compensation zone, whereby the compensated layout design describes a modified physical layout of the fabrication layer within the reticle field.

13. A method according to claim 11, comprising generating a reticle using the compensated layout design and patterning a fabrication layer of a wafer using said reticle.

14. A method according to claim 11, wherein the process and equipment conditions are specific to a photolithographic patterning tool used in the manufacturing process and the step of deriving the variability signature comprises printing a plurality of test patterns on wafers and acquiring measurements of features of the patterns formed on the wafers.

15. A method according to claim 14, wherein the step of generating the compensation models or rules comprises generating the compensation models or rules based on the acquired measurements.

16. A method according to claim 11, wherein the process and equipment conditions are specific to a wafer exposure stage of the manufacturing process.

17. A method according to claim 11, wherein the process and equipment conditions are specific to a resist stage of the manufacturing process.

18. A method according to claim 11, wherein the process and equipment conditions are specific to an etch stage of the manufacturing process.

19. A method according to claim 11, comprising receiving the target layout design from a customer.

20. A method according to claim 11, wherein the process and equipment conditions are specific to a photolithographic patterning tool used by a wafer fabrication facility in a wafer exposure stage of the manufacturing process, and the method further comprises delivering the compensated layout design to a mask manufacturer for manufacture of a mask including a reticle in accordance with the compensated layout design, and delivering the mask to the wafer fabrication facility for patterning a layer of a wafer with the mask using the specific photolithographic patterning tool.

21. A method according to claim 11, wherein the target layout design has multiple segments containing design features of respective integrated circuit devices and the method comprises applying the compensation models or rules to the design features based on the locations of the respective features in the reticle field.

22. A method according to claim 11, further comprising manufacturing a reticle in accordance with the compensated layout design and patterning a wafer using said reticle.

23. A method of compensating a target layout design for use in manufacture of integrated circuit devices, said method comprising:
 receiving the target layout design from a customer,
 deriving a systematic variability signature, on a full reticle field-wide basis, based on process and equipment conditions applicable to the manufacturing process,
 generating compensation models or rules from the systematic variability signature, wherein the effects of said models or rules encompass the whole reticle field and are field location dependent, and
 applying the compensation models or rules to the target layout design, in a field location dependent manner, to produce a compensated layout design,
 and wherein the process and equipment conditions are specific to a photolithographic patterning tool used by a wafer fabrication facility in a wafer exposure stage of the manufacturing process, and the method further comprises delivering the compensated layout design to a mask manufacturer for manufacture of a mask including a reticle in accordance with the compensated layout design, and delivering the mask to the wafer fabrication facility for patterning a layer of a wafer with the mask using the specific photolithographic patterning tool.

24. A method according to claim 23, comprising receiving the target layout design from a customer.

25. A method according to claim 23, further comprising delivering the compensated layout design to the customer or to a manufacturing service provider.

26. A method according to claim 23, comprising delivering the compensated layout design to a mask manufacturer and wherein the mask manufacturer manufactures a mask including a reticle in accordance with the compensated layout design.

27. A method according to claim 23, wherein the target layout design has multiple segments containing design features of respective integrated circuit devices and the method comprises applying the compensation models or rules to the design features based on the locations of the respective features in the reticle field.

28. A method according to claim 23, further comprising manufacturing a reticle in accordance with the compensated layout design and patterning a wafer using said reticle.

29. A method of compensating one or more target layout designs used in manufacture of integrated circuit devices, wherein:
 one or more customers specify one mask making and wafer fabrication process flow to a support service provider and each customer delivers one or more target layout designs intended for the specified mask making and wafer fabrication process flow to the support service provider,
 for the mask making and wafer fabrication process flow specified by the customers, the support service provider performs a characterization step to derive a systematic variability signature based on process and equipment conditions specific to the mask making and wafer fabrication process flow and generates compensation models or rules from the variability signature,
 for each target layout design, the support service provider applies the compensation models or rules generated from the variability signature based on the process and equipment conditions specific to the mask making and wafer fabrication process flow specified by the customer to generate a compensated layout design, and
 the support service provider delivers each compensated layout design to the customer, to a mask manufacturer, or directly to a device manufacturing facility.

30. A method according to claim 29, wherein the support service provider delivers each compensated layout design to the customer, the customer delivers the compensated layout design to a mask manufacturer, the mask manufacturer manufactures a mask in accordance with the compensated layout design and delivers the mask to a device manufacturing facility, and the device manufacturing facility utilizes the mask in a photolithographic step in a wafer fabrication process, and wherein the mask making and wafer fabrication process flow implemented by the mask manufacturer and the device manufacturing facility are in accordance with said one mask making and wafer fabrication process flow specified by the customer.

31. A method according to claim 29, wherein the support service provider delivers each compensated layout design to a mask manufacturer, the mask manufacturer manufactures a mask in accordance with the compensated layout design and delivers the mask to a device manufacturing facility, and the device manufacturing facility utilizes the mask in a photolithographic step in a wafer fabrication process, and wherein the mask making and wafer fabrication process flow implemented by the mask manufacturer and the device manufacturing facility are in accordance with said one mask making and wafer fabrication process flow specified by the customer.

32. A method according to claim 29, wherein the support service provider delivers a compensated layout design to a mask manufacturer and the mask manufacturer manufactures a mask in accordance with the compensated layout design and delivers the mask to the respective customer or to a wafer fabrication facility specified by the customer.

33. A method according to claim 29, wherein the characterization step comprises printing a plurality of test patterns on wafers and measuring features of the patterns formed on the wafers.

34. A method according to claim 33, further comprising generating a set of rules based on the measurements.

35. A method according to claim 33, further comprising fitting a model to the measurements.

36. A method according to claim 29, wherein the characterization step comprises deriving respective signatures of at least two functionally similar process tools and identifying components of the signatures that are similar and components that are dissimilar.

* * * * *